United States Patent
Koyanagi et al.

(10) Patent No.: US 10,923,560 B2
(45) Date of Patent: Feb. 16, 2021

(54) CAPACITOR INCLUDING ELECTRODE AND DIELECTRIC LAYER EACH CONTAINING SILICON, AND METHOD FOR MANUFACTURING CAPACITOR

(71) Applicant: Panasonic Intellectual Property Management Co., Ltd., Osaka (JP)

(72) Inventors: Takahiro Koyanagi, Osaka (JP); Yuuko Tomekawa, Osaka (JP); Takeshi Harada, Toyama (JP); Yoshio Kawashima, Toyama (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 16/259,102

(22) Filed: Jan. 28, 2019

(65) Prior Publication Data
US 2019/0252488 A1 Aug. 15, 2019

(30) Foreign Application Priority Data
Feb. 15, 2018 (JP) .................. 2018-025144

(51) Int. Cl.
*H01L 21/00* (2006.01)
*H01L 49/02* (2006.01)
(Continued)

(52) U.S. Cl.
CPC .......... *H01L 28/40* (2013.01); *H01L 21/0228* (2013.01); *H01L 21/02181* (2013.01);
(Continued)

(58) Field of Classification Search
CPC ......... H01L 28/40; H01L 28/60; H01L 28/91; H01L 21/02189; H01L 21/0228; H01L 21/02181
See application file for complete search history.

(56) References Cited

U.S. PATENT DOCUMENTS 7,485,585 B2 * 2/2009 Park .................. H01L 21/31645
438/781
9,627,501 B2 * 4/2017 Gealy ............... C23C 16/45529
(Continued)

FOREIGN PATENT DOCUMENTS

JP 2000-058650 2/2000
JP 2003-045960 2/2003
(Continued)

OTHER PUBLICATIONS

Soon-Wook Kim et al., "Effects of electrical stress on the leakage current characteristics of multilayer capacitor structures", Applied Physics Letters 96, 262904, Jul. 1, 2010.
(Continued)

*Primary Examiner* — Nicholas J Tobergte
(74) *Attorney, Agent, or Firm* — McDermott Will and Emery LLP

(57) ABSTRACT

A capacitor includes a first electrode; a second electrode facing the first electrode; and a dielectric layer which is disposed between the first electrode and the second electrode and which is in contact with the first electrode. The first electrode includes a first portion including an interface between the first electrode and the dielectric layer, the dielectric layer includes a second portion including the interface, and the first portion and the second portion each contain silicon. A concentration distribution of the silicon along a thickness direction of the first portion and the second portion includes a convex portion intersecting the interface.

6 Claims, 8 Drawing Sheets

(51) Int. Cl.
  *H01L 21/3215* (2006.01)
  *H01L 21/285* (2006.01)
  *H01L 21/02* (2006.01)
  *H01L 27/146* (2006.01)
  *H01L 27/108* (2006.01)

(52) U.S. Cl.
  CPC .. *H01L 21/02189* (2013.01); *H01L 21/02205* (2013.01); *H01L 21/02299* (2013.01); *H01L 21/28568* (2013.01); *H01L 21/3215* (2013.01); *H01L 27/14636* (2013.01); *H01L 27/14665* (2013.01); *H01L 28/60* (2013.01); *H01L 28/91* (2013.01); *H01L 27/10814* (2013.01); *H01L 27/10852* (2013.01); *H01L 27/14609* (2013.01)

(56) References Cited

U.S. PATENT DOCUMENTS

| | | |
|---|---|---|
| 2003/0025207 A1 | 2/2003 | Harada |
| 2004/0171276 A1 | 9/2004 | Watanabe et al. |
| 2007/0228442 A1* | 10/2007 | Kakimoto ........... H01L 21/0228 257/310 |
| 2010/0327409 A1 | 12/2010 | Kume et al. |
| 2014/0043722 A1 | 2/2014 | Hirata et al. |

FOREIGN PATENT DOCUMENTS

| | | |
|---|---|---|
| JP | 2007-115986 | 5/2007 |
| JP | 2008-078516 | 4/2008 |
| JP | 2014-036140 | 2/2014 |
| JP | 2014-067866 | 4/2014 |
| WO | 2003/019643 | 3/2003 |
| WO | 2009/093633 | 7/2009 |

OTHER PUBLICATIONS

T. S. Boscke et al., "Ferroelectricity in Hafnium Oxide: CMOS compatible Ferroelectric Field Effect Transistors", IEEE, IEDM 11, 547-550, Dec. 5, 2011.

* cited by examiner

CAPACITOR INCLUDING ELECTRODE AND DIELECTRIC LAYER EACH CONTAINING SILICON, AND METHOD FOR MANUFACTURING CAPACITOR

BACKGROUND

1. Technical Field

The present disclosure relates to a capacitor and a method for manufacturing a capacitor.

2. Description of the Related Art

Heretofore, in order to improve the degree of integration of a semiconductor integrated circuit, an increase in capacity density per unit area of a capacitor element of the semiconductor integrated circuit has been investigated. As one method to improve the capacity density, formation of an insulating film of a capacitor element using a high dielectric constant material has been studied. For example, "Effects of electrical stress on the leakage current characteristics of multilayer capacitor structures", Appl. Phys. Lett. 96, 262904, 2010, authored by Soon-Wook Kim (hereinafter, referred to as Non-Patent Document 1) and "Ferroelectricity in Hafnium Oxide: CMOS compatible Ferroelectric Field Effect Transistors" IEEE, IEDM, 11, 547-550, 2011, authored by T. S. Boscke have disclosed a capacitor element which includes an insulating film formed from a hafnium oxide ($HfO_2$) having a higher dielectric constant than that of a silicone oxide ($SiO_2$) which has been frequently used.

SUMMARY

In one general aspect, the techniques disclosed here feature a capacitor which comprises: a first electrode, a second electrode facing the first electrode, and a dielectric layer which is disposed between the first electrode and the second electrode and which is in contact with the first electrode. The first electrode includes a first portion including an interface between the first electrode and the dielectric layer, the dielectric layer includes a second portion including the interface, and the first portion and the second portion each contain silicon. A concentration distribution of the silicon along a thickness direction of the first portion and the second portion includes a convex portion intersecting the interface.

It should be noted that general or specific embodiments may be implemented as a system, a method, an integrated circuit, a computer program, a storage medium, or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

Figure 1:
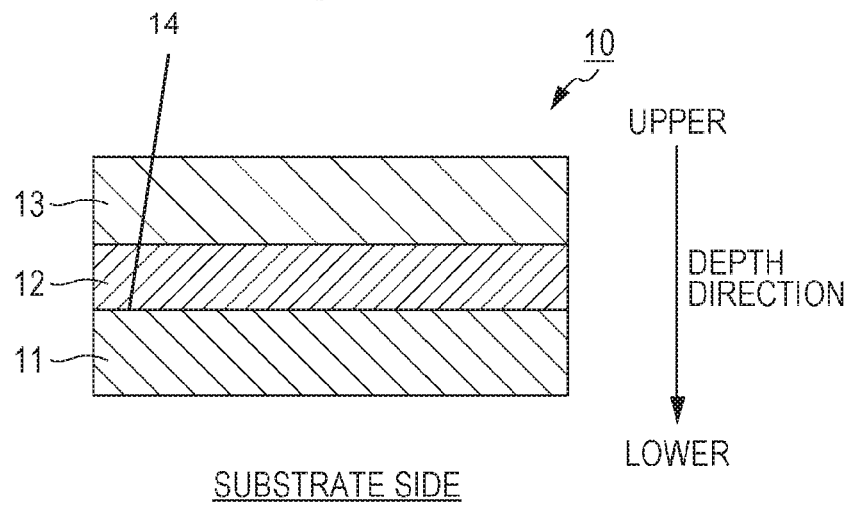
FIG. 1 is a schematic view showing one example of a cross-sectional structure of a capacitor element according to an embodiment.

Underlying Knowledge Forming Basis of the Present Disclosure

An electrostatic capacity C of a capacitor element is represented by $C=\varepsilon \times \varepsilon_0 \times S/t$ when $\varepsilon$, $\varepsilon_0$, t, and S indicate the dielectric constant of a dielectric layer sandwiched between electrodes, the dielectric constant of vacuum, the thickness of the dielectric layer, and the area of the electrode, respectively. Hence, as a method to increase the capacity density, besides an increase in dielectric constant $\varepsilon$ of the dielectric layer, for example, a decrease in thickness t of the dielectric layer may also be performed.

In addition, in general, in order to increase a withstand voltage of the capacitor element, the thickness of the dielectric layer is increased, or a low dielectric constant material having a wide band gap is used. In addition, the withstand voltage is a voltage at which a leak current flowing between the electrodes is remarkably increased.

However, as disclosed in Non-Patent Document 1, as the thickness of a hafnium oxide ($HfO_2$) is increased, a withstand field strength is decreased. In addition, the withstand field strength is an electric field strength at which a leak current is remarkably increased and is used as the meaning similar to that of the withstand voltage. Hence, when the dielectric layer is formed using a hafnium oxide, even if the thickness of the dielectric layer is increased, the withstand voltage may be disadvantageously decreased.

The summary of one aspect of the present disclosure is as follows.

A capacitor according to one aspect of the present disclosure comprises: a first electrode; a second electrode facing the first electrode; and a dielectric layer which is disposed between the first electrode and the second electrode and which is in contact with the first electrode. The first electrode includes a first portion including an interface between the first electrode and the dielectric layer, the dielectric layer includes a second portion including the interface, and the first portion and the second portion each contain silicon. A concentration distribution of the silicon along a thickness direction of the first portion and the second portion includes a convex portion intersecting the interface.

Accordingly, since the silicon contained in the dielectric layer compensates for defects in the dielectric layer, a current path formation can be suppressed. Hence, the withstand voltage of the capacitor can be increased. As described above, according to this aspect, a capacitor excellent in withstand voltage characteristics can be realized.

In addition, in the capacitor according to the aspect of the present disclosure, for example, the dielectric layer may be made of at least one selected from the group consisting of a hafnium oxide and a zirconium oxide.

As a result, since a hafnium oxide and a zirconium oxide are materials each having a high dielectric constant, an increase in capacity of the capacitor can be realized. Hence, according to this aspect, the increase in capacity and the increase in withstand voltage of the capacitor can be simultaneously achieved.

In addition, in the capacitor according to the aspect of the present disclosure, for example, a maximum concentration of the silicon in the convex portion may be located in the first portion.

Accordingly, since the silicon is distributed in the convex portion so as to spread to two sides of the position at which the concentration of the silicon is maximized, and the peak is located in the first electrode, in the dielectric layer in the vicinity of the interface with the first electrode, a large amount of silicon is contained. Hence, defects in the dielectric layer in the vicinity of the interface are effectively compensated for, and the withstand voltage of the capacitor can be increased.

In addition, in the capacitor according to the aspect of the present disclosure, for example, a maximum concentration of the silicon in the convex portion may be 1 to 25 atomic percent.

Accordingly, since the content of the silicon at the position of the convex portion at which the concentration of the silicon is maximized is 1 percent by atom or more, a sufficient amount of silicon capable of compensating for defects is contained in the dielectric layer. Hence, defects in the dielectric layer are compensated for, and as a result, the withstand voltage of the capacitor can be increased. In addition, since the content of the silicon at the position of the convex portion at which the concentration of the silicon is maximized is 25 percent by atom or less, a hafnium oxide or a zirconium oxide has a high dielectric constant. Hence, the capacity of the capacitor can be increased. As described above, according to this aspect, the increase in capacity and the increase in withstand voltage of the capacitor can be simultaneously achieved.

In addition, in the capacitor according to the aspect of the present disclosure, for example, the first electrode may be made of at least one selected from the group consisting of a titanium nitride and a tantalum nitride.

Accordingly, since a nitride metal film, such as a titanium nitride film or a tantalum nitride film, has a high affinity to a semiconductor process using a dielectric layer, a capacitor excellent in withstand voltage characteristics can be realized.

In addition, in the capacitor according to the aspect of the present disclosure, for example, the position of the convex portion at which the concentration of the silicon is maximum may be located in a range of ±10 nm from the interface described above in the thickness direction.

Accordingly, since a large amount of silicon is distributed at least in a range of ±10 nm from the interface which is used as the basis, a sufficient amount of silicon which compensates for defects is also contained in the dielectric layer. Hence, defects in the dielectric layer are compensated for, and as a result, the withstand voltage of the capacitor can be increased.

In addition, for example, an image sensor according to another aspect of the present disclosure includes the capacitor described above.

Accordingly, since the image sensor includes the capacitor excellent in withstand voltage characteristics, the withstand voltage characteristics of the image sensor can also be improved.

In addition, for example, a memory device according to another aspect of the present disclosure includes the capacitor described above.

Accordingly, since the memory device includes the capacitor excellent in withstand voltage characteristics, the withstand voltage characteristics of the memory device can also be improved.

In addition, for example, a method for manufacturing a capacitor according to another aspect of the present disclosure comprises: forming a first electrode; introducing silicon to a surface of the first electrode; and forming a dielectric layer on the first electrode. Introducing the silicon is performed before forming the dielectric layer.

Accordingly, since the first electrode contains silicon, when the dielectric layer is laminated on the first electrode, silicone can be effectively contained in the dielectric layer thus laminated. Hence, defects in the dielectric layer are compensated for by silicon, and as a result, a current path formation can be suppressed.

In addition, the silicon may be introduced by exposing the first electrode to a gas containing a silicon compound. Since silicon is added to the first electrode by exposing the first electrode to the silicon compound, the amount of silicon added to the first electrode can be uniformed in the plane. In particular, as in the case of a non-parallel plate type capacitor, such as a capacitor having a trench structure, even if the first electrode has a three-dimensional structure, silicon can be uniformly added from the surface thereof which is exposed to the silicon compound. Hence, silicon can be suppressed from being localized, and defects in the dielectric layer can be uniformly compensated for in the plane, so that a current path formation can be suppressed.

As described above, according to this aspect, a capacitor excellent in withstand voltage characteristics can be manufactured.

In addition, for example, the silicon compound is at least one of silane ($SiH_4$), disilane ($Si_2H_6$), dichlorosilane ($SiH_2Cl_2$), trichlorosilane ($SiHCl_3$), tetrachlorosilane ($SiCl_4$), and tetrafluorosilane ($SiF_4$).

Accordingly, silicon contained in the silicon compound can be uniformly added into the first electrode.

Hereinafter, with reference to the drawings, embodiments of the present disclosure will be described in detail. In addition, the following embodiments each show a comprehensive or a concrete example. The values, the shapes, the materials, the constituent elements, the arrangement of the constituent elements and the connection mode therebetween, the manufacturing steps, the order of the manufacturing steps, and the like in the following embodiments are described by way of example and are not intended to limit the present disclosure. Various modes to be described in this specification may be used in combination as long as no conflict is generated therebetween. In addition, among the constituent elements of the following embodiments, a constituent element not described in an independent claim which shows the topmost concept is described as an arbitrary constituent element.

In addition, the drawings are each a schematic view and are not always precisely drawn. Hence, for example, the scales of the drawings are not always equal to each other. In addition, in the drawings, constituent elements having substantially the same function are each designated by a common reference numeral, and description thereof may be omitted or simplified in some cases.

In addition, in this specification, the terms "upper" and "lower" do not indicate an upper direction (vertically upper direction) and a lower direction (vertically lower direction), respectively, in absolute spatial awareness and are each used as a term defined by a relative positional relationship based on the order of lamination of a laminate structure. In addition, the terms "upper" and "lower" are applied not only to the case in which between two constituent elements disposed with a space therebetween, another constituent element is present, but also to the case in which two constituent elements are disposed so as to be in close contact with each other.

Embodiments

[Structure]

FIG. 1 is a schematic view showing one example of a cross-sectional structure of a capacitor element 10 according to an embodiment.

As shown in FIG. 1, the capacitor element 10 includes a lower electrode 11, a dielectric layer 12, and an upper electrode 13. The capacitor element 10 is formed by laminating at an upper side of a substrate (not shown), the lower electrode 11, the dielectric layer 12, and the upper electrode 13 in this order.

The lower electrode 11 and the upper electrode 13 are examples of the first electrode and the second electrode, respectively, disposed to face each other. The dielectric layer 12 is disposed between the lower electrode 11 and the upper electrode 13 and is in contact with each of the lower electrode 11 and the upper electrode 13.

As shown in FIG. 1, the capacitor element 10 is a parallel plate type capacitor element. In particular, the lower electrode 11, the dielectric layer 12, and the upper electrode 13 are each formed to have a flat shape having an approximately uniform thickness. The lower electrode 11 and the upper electrode 13 are disposed parallel to each other with the dielectric layer 12 interposed therebetween. An upper surface of the lower electrode 11 is in contact with a lower surface of the dielectric layer 12. A lower surface of the upper electrode 13 is in contact with an upper surface of the dielectric layer 12.

In addition, an electrode area of the capacitor element 10 corresponds to an area at which the upper electrode 13 and the lower electrode 11 are overlapped with each other when viewed in plan. The "when viewed in plan" indicates the case in which the capacitor element 10 is viewed in a lamination direction. The lamination direction is a direction opposite to a depth direction shown in FIG. 1 and, that is, is a direction from a lower side to an upper side.

The lower electrode 11 is one example of the first electrode included in the capacitor element 10. The lower electrode 11 is formed using an electrically conductive material. As the electrically conductive material, a single metal, such as titanium (Ti), aluminum (Al), gold (Au), or platinum (Pt) may be used. Alternatively, as the electrically conductive material, an electrically conductive nitride metal film, such as a titanium nitride (TiN) film, a tantalum nitride (TaN) film, or a hafnium nitride (HfN) film, may also be used. In addition, as the electrically conductive material, an electrically conductive oxide, such as indium tin oxide (ITO) or zinc oxide (ZnO), may also be used.

The lower electrode 11 is formed, for example, using a metal organic chemical vapor deposition (MOCVD) method, an atomic layer deposition (ALD) method, a sputtering method, or the like. The lower electrode 11 is formed using an electrically conductive material, for example, at an upper side of the substrate to have a thin film shape. The thickness of the lower electrode 11 is, for example, 15 nm but is not limited thereto.

The upper electrode 13 is one example of the second electrode included in the capacitor element 10. The upper electrode 13 may be formed from either the same material as that of the lower electrode 11 or a material different therefrom. As is the case of the lower electrode 11, the upper electrode 13 is formed using an MOCVD method, an ALD method, a sputtering method, or the like. The upper electrode 13 is formed using an electrically conductive material to have a thin film shape, for example, in a region on the dielectric layer 12 and in a region overlapped with the lower electrode 11 when viewed in plan. The thickness of the upper electrode 13 is, for example, 200 nm but is not limited thereto.

The dielectric layer 12 is formed using a high-k material having a dielectric constant higher than that of a silicone oxide ($SiO_2$). In particular, the dielectric layer 12 contains an oxide of hafnium (Hf) or zirconium (Zr) as a primary component. The dielectric layer 12 contains 50 percent by mole or more of a hafnium oxide or a zirconium oxide. The dielectric layer 12 is formed using an ALD method, an MOCVD method, an electron beam (EB) deposition method, or the like. The dielectric layer 12 is formed, for example, on the lower electrode 11 to have a thin film shape using a dielectric thin film formed from a hafnium oxide or a zirconium oxide.

The dielectric layer 12 has a monoclinic system crystalline structure. The dielectric layer 12 is a paraelectric layer.

As the thickness of the dielectric layer 12, a physical thickness thereof may be measured, for example, from a photo taken using a transmission electron microscope. Alternatively, when an area (S) of the capacitor element 10 and a dielectric constant (ε) of the dielectric layer 12 are known, from a capacity (C) of the capacitor element 10, an average thickness (t) may also be calculated from the equation: $t=\varepsilon \times S/C$.

The crystalline structure of the dielectric layer 12 may be known by performing an analysis using an X-ray diffraction (XRD) method. In addition, the crystalline structure may also be known by a cross-sectional transmission electron microscope (TEM).

The lower electrode 11 and the dielectric layer 12 each contain silicon (Si). A concentration distribution of silicon along a thickness direction of the lower electrode 11 and the dielectric layer 12 includes a convex portion intersecting an interface 14 between the lower electrode 11 and the dielectric layer 12. The details will be described later with reference to examples.

The concentrations of silicon contained in the lower electrode 11 and the dielectric layer 12 may be measured using a time-of-flight secondary ion mass spectrometry (ToF-SIMS). In addition, the measurement methods of the thickness, the crystalline structure, and the concentration of silicon of each layer are not limited thereto.

In addition, the cross-sectional structure of the capacitor element 10 is not limited to the example shown in FIG. 1. That is, the capacitor element 10 is not always required to be a parallel plate type capacitor element.

Figure 2:
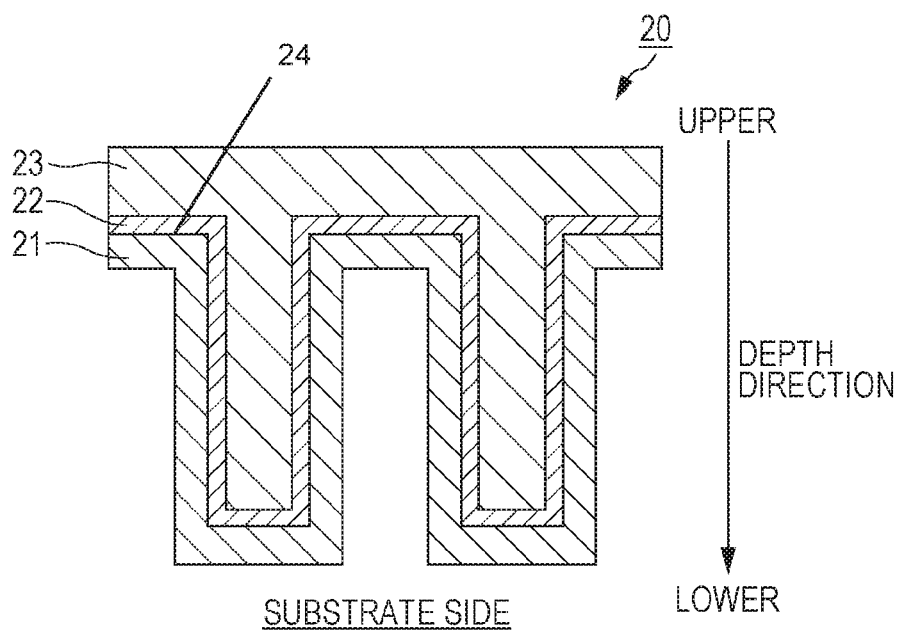
FIG. 2 is a schematic view showing another example of the cross-sectional structure of the capacitor element according to the embodiment.

FIG. 2 is a schematic view showing a cross-sectional structure of a capacitor element 20 according to another example of this embodiment. The capacitor element 20 shown in FIG. 2 is not a parallel plate type capacitor element and is a three-dimensional structure capacitor element. In particular, the capacitor element 20 includes a lower electrode 21, a dielectric layer 22, and an upper electrode 23. In addition, except for that the cross-sectional structure of the capacitor element 20 is different from that of the capacitor element 10 shown in FIG. 1, materials forming the respective layers, manufacturing methods thereof, and the like are similar to those of the capacitor element 10.

As shown in FIG. 2, an interface 24 between the lower electrode 21 and the dielectric layer 22 has a trench shape recessed in a direction from the upper electrode 23 to the lower electrode 21, that is, in a depth direction. The dielectric layer 22 is provided along the trench shape to have an approximately uniform thickness. In the example shown in FIG. 2, the lower electrode 21 is also provided along the trench shape to have an approximately uniform thickness. The upper electrode 23 is formed so that the upper surface is approximately flat, and the lower surface is provided along the trench shape.

Accordingly, at a side surface portion of the groove of the trench shape, a region at which the upper electrode 23 and the lower electrode 21 face each other is increased. Hence, when viewed in plan, although the size of the capacitor element 20 is the same as that of the capacitor element 10 shown in FIG. 1, the surface area of the capacitor element 20 is increased, and as a result, the capacity is increased.

In addition, in FIG. 2, although the trench shape having two grooves is shown by way of example, the number of grooves may be either one or 3 or more. In addition, when the number of grooves is increased, or the depth of the groove is increased, the capacity of the capacitor element 20 can be increased.

[Method for Manufacturing Capacitor Element]

Next, a method for manufacturing the capacitor element 10 of this embodiment will be described with reference to FIGS. 3A to 3D. FIGS. 3A to 3D each show a cross-sectional view of each step of the method for manufacturing the capacitor element 10 according to this embodiment.

The method for manufacturing the capacitor element 10 comprises: a step of forming the lower electrode 11; a step of containing silicon in the lower electrode 11; and a step of laminating the dielectric layer 12 on the lower electrode 11. The step of containing silicon in the lower electrode 11 is performed before the step of laminating the dielectric layer 12.

Figure 3A:
FIG. 3A is a cross-sectional view showing one step of a method for manufacturing the capacitor element according to the embodiment.

In particular, first, as shown in FIG. 3A, at an upper side of the substrate (not shown), the lower electrode 11 is formed. For example, a TiN film is formed using an MOCVD method, so that the lower electrode 11 is formed. The thickness of the TiN film is, for example, 15 nm but is not limited thereto. As a raw material used for the MOCVD method, for example, tetrakis(dimethylamide)titanium (TDMAT: Ti[N(CH$_3$)$_2$]$_4$) may be mentioned.

Figure 3B:
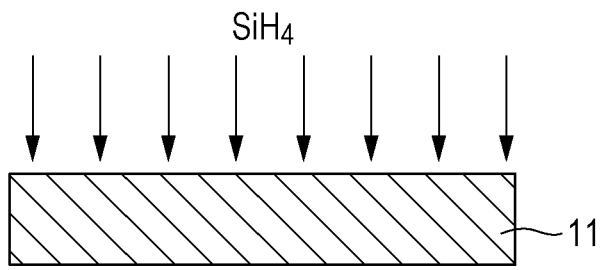
FIG. 3B is a cross-sectional view showing one step of the method for manufacturing the capacitor element according to the embodiment.

Next, as shown in FIG. 3B, the lower electrode 11 is exposed to a gas containing a silicon compound, so that silicon is contained in the lower electrode 11. In particular, since the gas containing a silicon compound is supplied into a chamber in which the lower electrode 11 is disposed, a surface of the lower electrode 11 is exposed to the silicon compound. The gas containing a silicon compound is, for example, a silane (SiH$_4$) gas but is not limited thereto. For example, as the silicon compound, disilane (Si$_2$H$_6$), dichlorosilane (SiH$_2$Cl$_2$), trichlorosilane (SiHCl$_3$), tetrachlorosilane (SiCl$_4$), or tetrafluorosilane (SiF$_4$) may also be used.

Figure 3C:
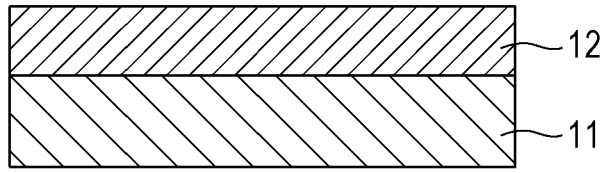
FIG. 3C is a cross-sectional view showing one step of the method for manufacturing the capacitor element according to the embodiment.

Next, as shown in FIG. 3C, on the lower electrode 11 which is exposed to the silicon compound, by the use of an ALD method, the dielectric layer 12 is formed. A substrate temperature at this stage is, for example, 250° C. to 300° C. For example, a film is formed on the lower electrode 11 from a hafnium oxide (HfO$_x$), so that the dielectric layer 12 is formed.

A raw material used for the ALD method is tetrakis(ethylmethylamino)hafnium (TEMAH: Hf[NCH$_3$C$_2$H$_5$]$_4$). The raw material gas and an O$_3$ gas are alternately charged into a chamber, so that a HfO$_x$ film is grown on the lower electrode 11 which is exposed to the silane. In addition, the raw material may also be tetrakis(dimethylamino)hafnium (TDMAH: Hf[N(CH$_3$)$_2$]$_4$).

In addition, instead of the hafnium oxide, a film of a zirconium oxide (ZrO$_2$) may also be formed. The thickness of HfO$_x$ is, for example, 21 nm but is not limited thereto. In addition, subscripts x of HfO$_x$ and ZrO$_x$ are each a positive value. For example, x indicates two but is not limited thereto.

Figure 3D:
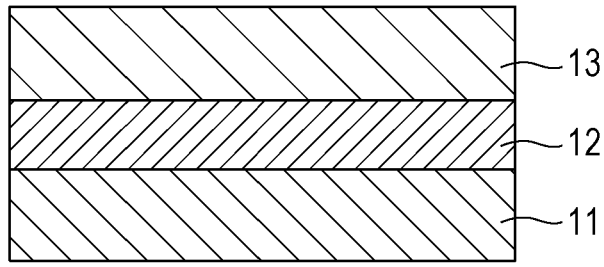
FIG. 3D is a cross-sectional view showing one step of the method for manufacturing the capacitor element according to the embodiment.

Next, as shown in FIG. 3D, the upper electrode 13 is formed on the dielectric layer 12. For example, by the use of an MOCVD method, a TiN film is formed on the dielectric layer 12, so that the upper electrode 13 is formed. The thickness of the TiN film is, for example, 70 nm but is not limited thereto.

At the final stage, after the upper electrode 13 is formed, a heat treatment is performed in a nitrogen (N$_2$) atmosphere. The heat treatment performed in a nitrogen atmosphere is also called nitrogen annealing. The nitrogen annealing is performed, for example, at 400° C. for 30 minutes.

In this embodiment, a high-temperature heat treatment is not performed on the capacitor element 10. In this embodiment, the high temperature is a temperature in a range in which the dielectric layer 12 cannot maintain a paraelectric property and is, for example, a temperature of 1,000° C. or more. If a heat treatment at 1,000° C. is performed, the crystalline structure of the dielectric layer 12 is changed from a monoclinic to an orthorhombic system. By the change in crystalline structure, the dielectric layer 12 is changed to a ferroelectric layer. The dielectric layer 12 changed to a ferroelectric layer as described above has hysteresis characteristics. Hence, when a heat treatment, such as nitrogen annealing, is performed on the capacitor element 10, the temperature of the heat treatment is, for example, set to 400° C. or less.

In addition, a method for manufacturing the capacitor element 20 having a trench structure is similar to that of the capacitor element 10 shown in FIGS. 3A to 3D. For example, before the lower electrode 21 is formed, an insulating film is formed at an upper side of the substrate, and this insulating film is then partially removed, so that at least one concave portion is formed. When the lower electrode 21 is formed along the concave portion described above, the lower electrode 21 having a trench structure is formed. After the lower electrode 21 is formed, as is the manufacturing method shown in FIGS. 3B to 3D, exposure to the silicon compound, formation of the dielectric layer 22, formation of the upper electrode 23, and nitrogen annealing are performed in this order. Accordingly, the capacitor element 20 having a trench structure is manufactured.

Hereinafter, an example of the present disclosure will be described. The following example is described to explain the present disclosure but not to limit the present disclosure.

The present inventors formed a sample of the capacitor element 10 according to the following example and a sample of a capacitor element according to a comparative example, and the characteristics of the samples thus formed were evaluated. First, manufacturing conditions of each sample will be described in detail.

Example

First, on a substrate formed of a Si water, as the lower electrode 11, a TiN film having a thickness of 15 nm was formed. Next, in a furnace in a high-temperature reduced-pressure atmosphere at 350° C. and 90 Torr, an exposure treatment using a $SiH_4$ gas was performed for 180 seconds. Next, as the dielectric layer 12, a $HfO_x$ film was formed to have a thickness of 21 nm. Next, as the upper electrode 13, a TiN film having a thickness of 70 nm was formed. Subsequently, a heat treatment was performed at 400° C. for 30 minutes in a nitrogen atmosphere. Accordingly, a capacitor element 10 according to an example was formed.

In addition, a $HfO_x$ forming the dielectric layer was deposited by an ALD method to form a film. A raw material used for the ALD method was tetrakis(ethylmethylamino) hafnium (TEMAH: $(Hf[NCH_3C_2H_5]_4)$. The raw material gas and an $O_3$ gas were alternately charged into a chamber, so that a $HfO_x$ film was grown on the lower electrode 11.

In addition, the TiN films forming the lower electrode 11 and the upper electrode 13 were each formed by an MOCVD method. A raw material used for the MOCVD method was, for example, terakis(dimethylamide)titanium (TDMAT: (Ti $[N(CH_3)_2]_4$).

In addition, except for that the upper electrode 13 was not formed, a film analysis sample was formed in accordance with manufacturing conditions similar to those of the capacitor element 10 according to the example.

Comparative Example

The present inventors also formed, as a comparative example, a capacitor element in which the lower electrode 11 was not exposed to the silicon compound. Except for that the lower electrode 11 was not exposed to $SiH_4$, the capacitor element according to the comparative example was formed in accordance with conditions similar to those of the example.

In addition, except for that the upper electrode was not formed, in accordance with manufacturing conditions similar to those of the capacitor element according to the comparative example, a film analysis sample was formed.
[Comparison of Characteristics]

Hereinafter, results obtained by analysis of the characteristics of the capacitor elements and the film analysis samples thus formed according to the example and the comparative example will be described.

First, with reference to FIGS. 4 and 5, the position of the interface between the lower electrode 11 and the dielectric layer 12 will be described.

Figure 4:
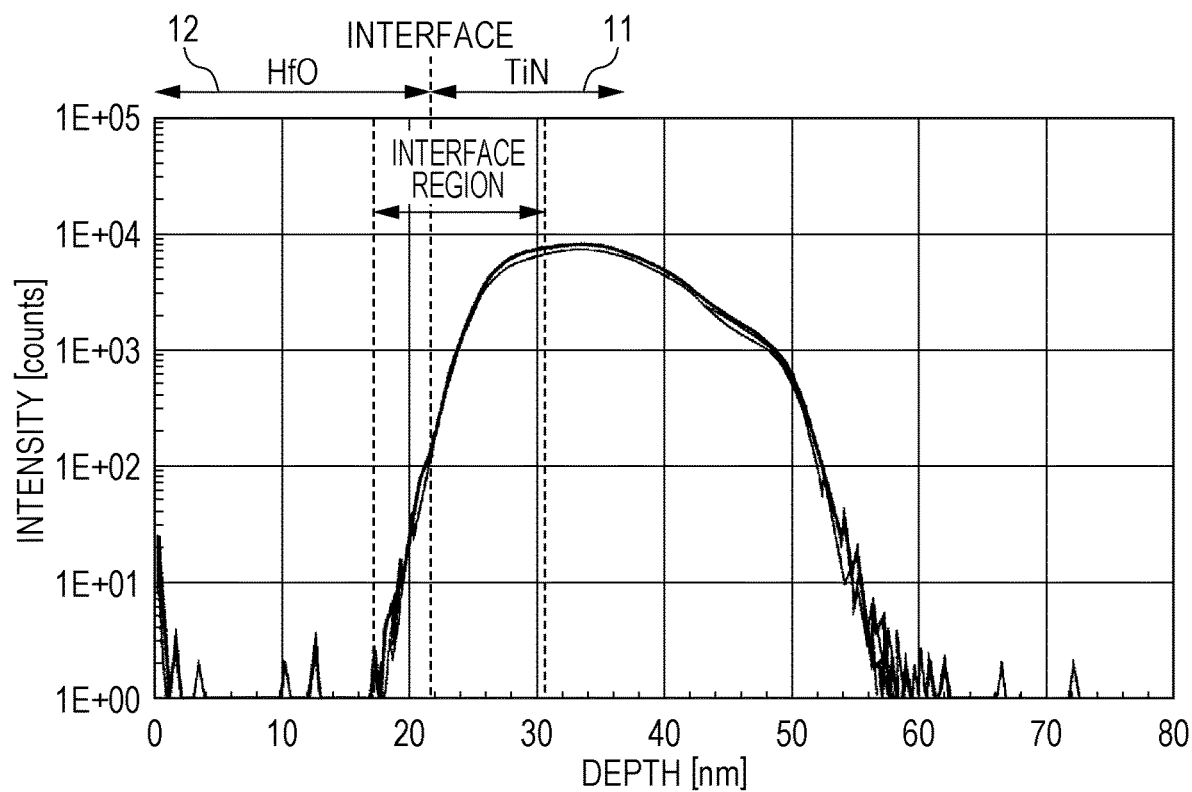
FIG. 4 is a graph showing a SIMS analysis result of TiN of the capacitor element according to the embodiment.

FIG. 4 is a graph showing a SIMS analysis result of TiN of the capacitor element according to this embodiment. FIG. 5 is a graph showing a SIMS analysis result of HfO of the capacitor element according to this embodiment.

Figure 5:
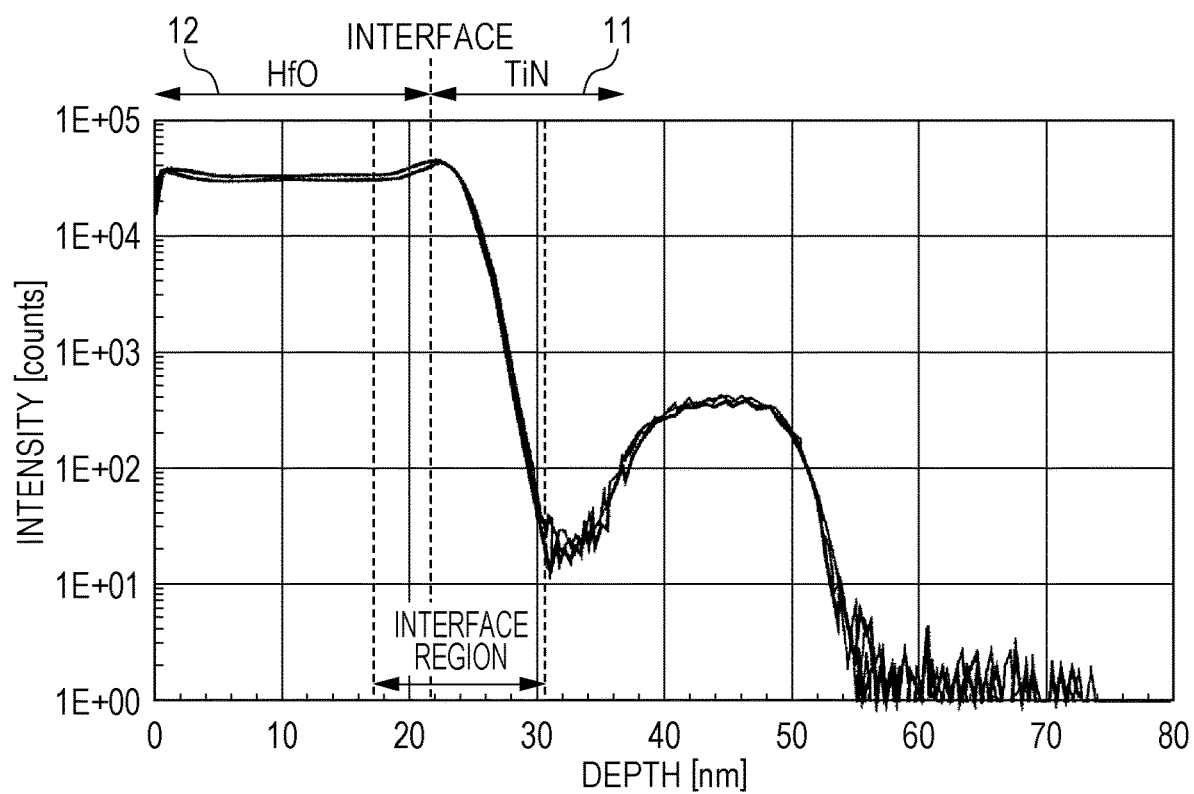
FIG. 5 is a graph showing a SIMS analysis result of HfO of the capacitor element according to the embodiment.

FIGS. 4 and 5 each show the evaluation result of the film analysis sample formed in each of the example and the comparative example obtained by a secondary ion mass analysis (SIMS) method. In FIGS. 4 and 5, the horizontal axis indicates the depth of the dielectric layer 12 from the upper surface thereof. The vertical axis of FIG. 4 indicates the intensity of Ti ions, and the vertical axis of FIG. 5 indicates the intensity of Hf ions. In addition, the intensity of ions corresponds to the amount (in particular, the concentration) of atoms contained in a film to be analyzed located at a corresponding depth.

As shown in FIG. 4, when the depth is more than approximately 17 nm, the intensity of Ti ions starts to increase and is saturated at a depth of approximately 26 nm. When the depth is more than approximately 32 nm, the intensity of Ti ions starts to decrease, and at a depth of approximately 58 nm, Ti ions are hardly detected.

On the other hand, as shown in FIG. 5, along the depth direction, the intensity of Hf ions is maintained approximately constant, and at a depth of approximately 20 nm, the intensity slightly increases. After reaching the maximum value at a depth of approximately 22 nm, the intensity of Hf ions decreases therefrom to a depth of approximately 30 nm.

In this embodiment, the position of the interface between the lower electrode 11 and the dielectric layer 12 is regarded as a position at which the maximum value of the intensity of Hf ions is obtained, that is, is regarded as a position at which the intensity of Hf ions starts to decrease. In particular, as shown in FIG. 5, the position of the interface is a position at a depth of approximately 22 nm. In the example and the comparative example, since the film formation conditions were set so that the HfO film had a thickness of 21 nm, it is understood that the interface is present at a position approximately equivalent to that estimated from the film formation conditions.

In addition, in this embodiment, an upper end position in a predetermined region (hereinafter, referred to as "interface region") including the interface is regarded as a position at which the intensity of Ti ions starts to increase. In particular, the upper end position in the interface region is, as shown in FIG. 4, a position at a depth of approximately 17 nm.

In addition, a lower end position in the interface region is regarded as a position at which the intensity of Hf ions stops to decrease. In particular, the lower end position in the interface region is, as shown in FIG. 5, a position at a depth of approximately 31 nm.

In addition, in FIGS. 4 and 5, although the graphs of the example and the comparative example are not separately shown, the graphs thereof are almost equivalent to each other. That is, by the presence or absence of the exposure treatment using the silicon compound, the crystalline structures of HfO and TiN are hardly influenced. Hence, even when the exposure treatment using the silicon compound is performed, a high dielectric property of the dielectric layer 12, the electrical conductivity of the lower electrode 11, and the like are almost the same as those obtained when the exposure treatment using the silicon compound is not performed.

Next, with reference to FIG. 6, the concentration distribution of silicon (Si) in the depth direction will be described.

Figure 6:
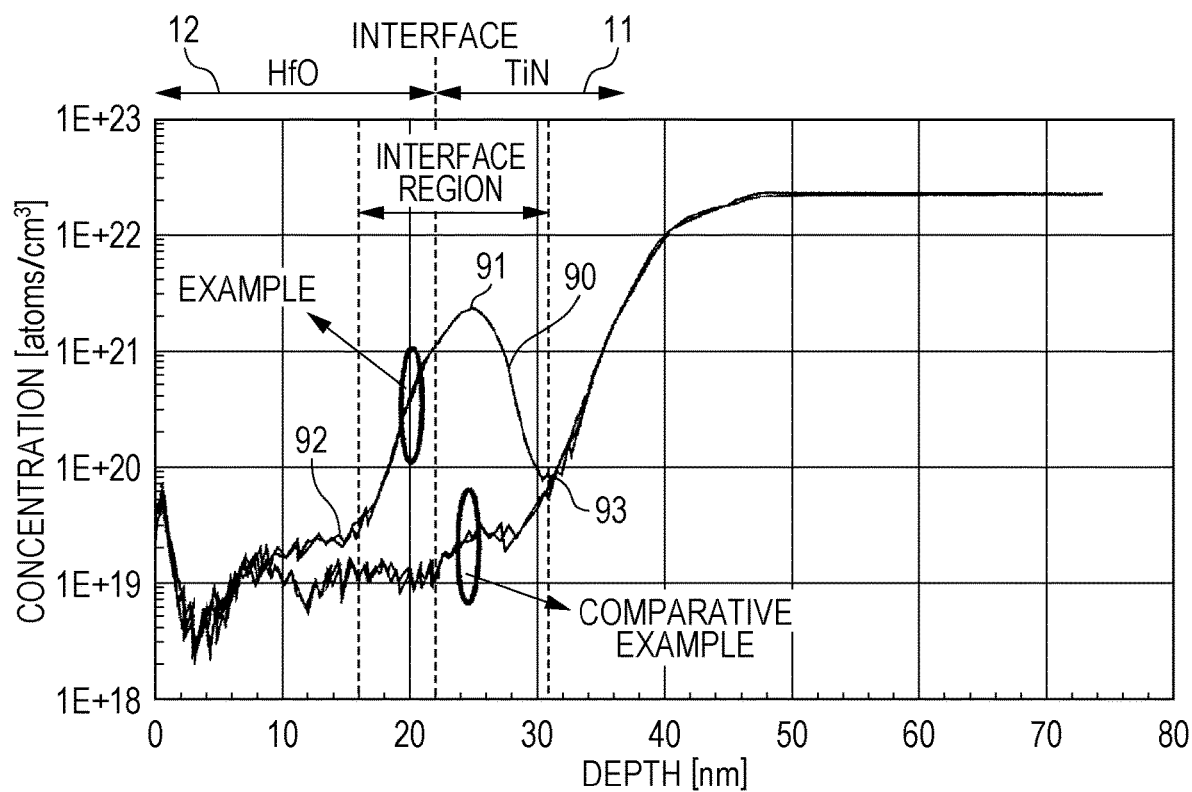
FIG. 6 is a graph showing a concentration distribution of silicon (Si) in a depth direction of the capacitor element according to the embodiment.

FIG. 6 is a graph showing the concentration distribution of silicon (Si) in the depth direction of the capacitor element according to this embodiment. In FIG. 6, the horizontal axis indicates the depth of the dielectric layer 12 from the upper surface thereof, and the vertical axis indicates the concentration of silicon.

As shown in FIG. 6, in particular, the concentration of silicon in the interface region is different between the example and the comparative example. In particular, the concentration of silicon in the sample according to the example is higher than the concentration of silicon in the sample according to the comparative example.

The concentration distribution of silicon in the sample according to the example has a convex portion 90 which extends to two sides of the interface between the lower electrode 11 and the dielectric layer 12. The convex portion 90 has a smooth mountain shape starting from an upper end 92 to a lower end 93 through a peak 91. In addition, the convex portion 90 may have a plurality of maximum values between the upper end 92 to the lower end 93 in some cases.

The peak 91 of the convex portion 90 is a portion at which the concentration of silicon is maximized in the vicinity of the interface. That is, the peak 91 shows the maximum value of the concentration of silicon in the convex portion 90. As shown in FIG. 6, the peak 91 of the convex portion 90 is located in the lower electrode 11. That is, the peak 91 of the convex portion 90 is located at a lower electrode 11 side than the interface. The peak 91 is located at a position at a depth of approximately 25 nm.

The content of silicon at the peak 91 is, for example, 1 to 25 percent by atom. The content of silicon at the peak 91 corresponds to the rate of silicon to the total elements at the depth of the peak 91. As shown in FIG. 6, the concentration at the peak 91 is approximately $2 \times 10^{21}$ atoms/cm$^3$ and is converted into a content of 4 percent by atom. The concentration of silicon gradually decreases toward the two sides of the peak 91, which is used as the basis, in the depth direction. For example, in a shallow direction, that is, at a position 5 nm apart toward an HfO$_x$ side, the concentration of silicon decreases to one half or less of that at the peak 91.

The upper end 92 of the convex portion 90 is a portion at which when viewed from the peak 91 in a shallow direction, the decrease in concentration of silicon is slowed. For example, when the gradient of decrease in concentration of silicon is calculated by every 1 nm from the peak 91 in a shallow direction, a position at which the gradient of decrease is decreased to one half or less is the upper end 92.

As shown in FIG. 6, the upper end 92 of the convex portion 90 is located in the dielectric layer 12. In particular, the upper end 92 is located in the dielectric layer 12 outside the interface region. In addition, the upper end 92 may be located in the interface region. The upper end 92 is located at a position at a depth of approximately 15 nm. As shown in FIG. 6, the concentration of silicon at the upper end 92 is approximately $3 \times 10^{19}$ atoms/cm$^3$.

The lower end 93 of the convex portion 90 is a portion at which when viewed from the peak 91 in a depth direction, the decrease in concentration of silicon is slowed. For example, when the gradient of decrease in concentration of silicon is calculated by every 1 nm from the peak 91 in a depth direction, a position at which the gradient of decrease is decreased to one half or less is the lower end 93. As shown in FIG. 6, the lower end 93 of the convex portion 90 is located in the lower electrode 11. In particular, the lower end 93 is located at a position approximately the same as that of the lower end position in the interface region. In addition, the lower end 93 may be located either in the interface region or in the lower electrode 11 outside the interface region. The lower end 93 is located at a position at a depth of approximately 31 nm. As shown in FIG. 6, the concentration of silicon at the lower end 93 is approximately $7 \times 10^{19}$ atoms/cm$^3$.

In addition, the upper end 92 and the lower end 93 of the convex portion 90 are each not limited to the example described above. For example, the upper end 92 and the lower end 93 each may be located at a position at which the gradient of decrease is zero. Alternatively, the upper end 92 and the lower end 93 each may be located at a position at which the concentration of silicon is lower than that at the peak 91 by one digit or more.

In this embodiment, the peak 91 of the convex portion 90 is located in a range of ±10 nm from the interface, which is used as the basis, in the depth direction. In addition, "−" indicates that the depth is shallow, and "+" indicates that the depth is deep. That is, the peak 91 is located in a range from a position 10 nm shallower than the interface to a position 10 nm deeper than the interface.

As shown in FIG. 6, the peak 91 is located in a range of +10 nm from the interface, which is used as the basis, in the depth direction. The peak 91 may be located in a range of −10 nm from the interface which is used as the basis. In addition, the upper end 92 and the lower end 93 are also located in a range of ±10 nm from the interface.

As described above, since the dielectric layer 12 is formed after the lower electrode 11 is exposed to the silicon compound, it is found that silicon is diffused not only to a lower electrode 11 side from the interface, which is used as the basis, but also to a dielectric layer 12 side. It is believed that silicon not only compensates for oxygen defects in the dielectric layer 12 but also substitutes for carbon contained in the lower electrode 11 and the dielectric layer 12. In addition, carbon is a component contained in the raw materials used for the formation of the lower electrode 11 and the dielectric layer 12.

Next, with reference to FIG. 7, a concentration distribution of carbon (C) in the depth direction will be described.

Figure 7:
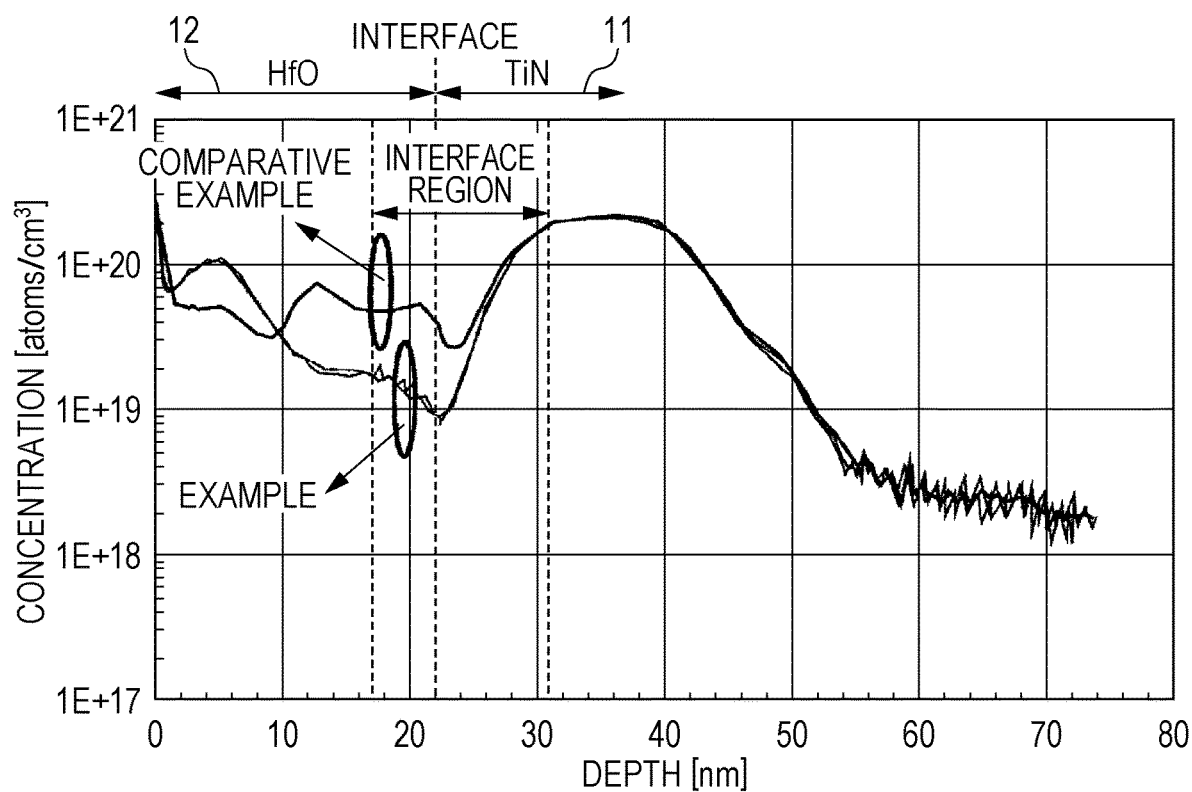
FIG. 7 is a graph showing a concentration distribution of carbon (C) in the depth direction of the capacitor element according to the embodiment.

FIG. 7 is a graph showing the concentration distribution of carbon (C) in the depth direction of the capacitor element according to this embodiment. In FIG. 7, the horizontal axis indicates the depth of the dielectric layer 12 from the upper surface thereof, and the vertical axis indicates the concentration of carbon.

As shown in FIG. 7, the concentration of carbon in the interface region is particularly different between the example and the comparative example. In particular, the concentration of carbon in the sample according to the example is low in the interface region as compared to that of the sample according to the comparative example. In more particular, in a dielectric layer 12 side from the interface, the concentration of carbon in the sample according to the example is lower than the concentration of carbon in the sample according to the comparative example.

As described above, when the dielectric layer 12 is laminated after the lower electrode 11 is exposed to the silicon compound, the amount of carbon contained as an impurity in the dielectric layer 12 decreases. Hence, since the amount of carbon functioning as a carrier trap decreases, a current path generation can be suppressed. Accordingly, the withstand voltage of the capacitor element 10 is improved.

In addition, although the analysis results of the film analysis samples each provided with no upper electrode 13 are shown in FIGS. 4 to 7, the results of the capacitor element 10 including the upper electrode 13 are also similar to those described above.

[Voltage-Current Characteristics]

Next, voltage-current characteristics of the capacitor element of each of the example and the comparative example will be described with reference to FIG. 8.

Figure 8:
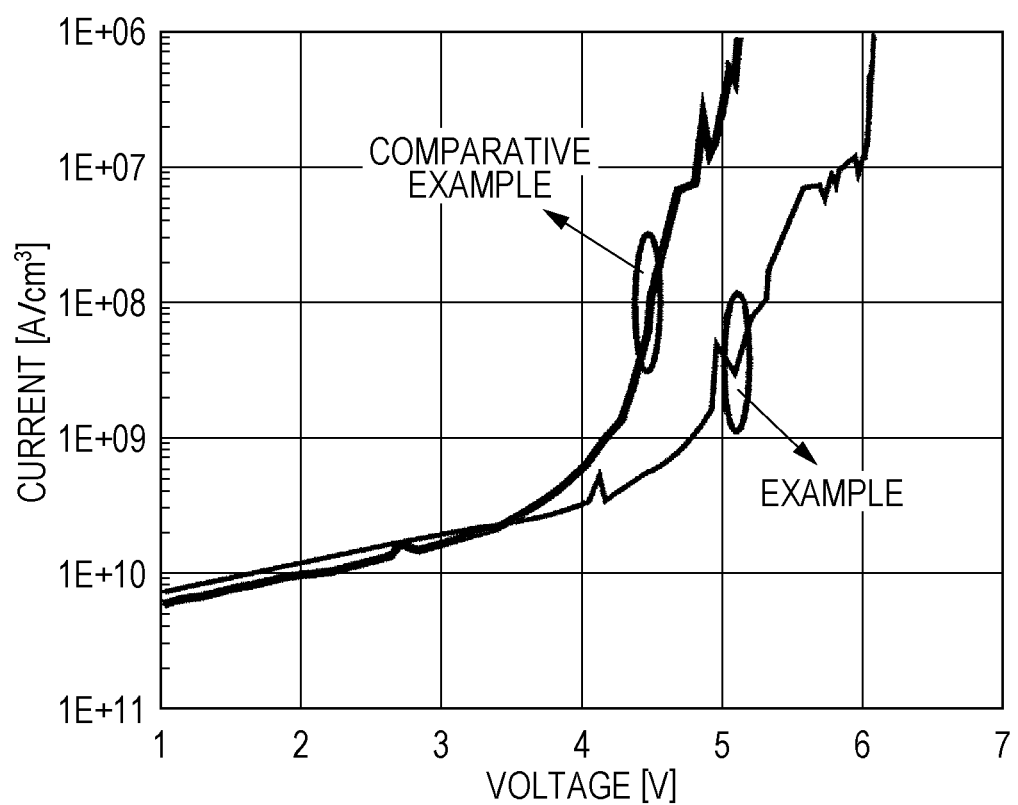
FIG. 8 is a graph showing one example of voltage-current characteristics of the capacitor element according to the embodiment.

FIG. 8 is a graph showing one example of voltage-current characteristics of the capacitor element according to this embodiment. In particular, FIG. 8 shows voltage-current characteristics of the example and the comparative example described above. For current measurement, a semiconductor parameter analyzer 4156C manufactured by Keysight Technologies was used. In particular, 0V was applied to the lower electrode 11, and while a voltage applied to the upper electrode 13 was swept in a range from 0 to 7 V, a leak current flowing between the lower electrode 11 and the upper electrode 13 was measured. When the current was more than $1 \times 10^9$ A/cm$^2$, the capacitor element 10 was assumed to be broken down, and the voltage at this stage was regarded as a breakdown voltage.

In the capacitor element according to the comparative example, the breakdown voltage was 4.18 V. On the other hand, in the capacitor element 10 according to the example, the breakdown voltage was 4.80 V.

From the results described above, it was confirmed that when the dielectric layer 12 formed from $HfO_x$ or the like was laminated after a silicon compound, such as $SiH_4$, was exposed to the lower electrode 11 formed from TiN or the like, the withstand voltage of the capacitor element 10 was improved.

In addition, as a breakdown model of $HfO_x$, a percolation model has been proposed. The percolation model is a model in which since a defect generated by a long-term stress forms a current path, a dielectric breakdown occurs thereby. In the capacitor element according to this embodiment, the percolation model may also be used.

Hence, it is believed that an effect of improving the withstand voltage by the addition of silicon to the dielectric layer 12 is obtained by suppression of the formation of a current path, and that this suppression is achieved since the ions thus added into the dielectric layer 12 compensate for defects therein and since the amount of carbon functioning as an impurity contained in the dielectric layer 12 is decreased.

In addition, in the case described above, as the lower electrode 11, although a TiN film is used, by the use of another nitride metal film, such as a TaN film or a HfN film, a result similar to that described above may also be obtained. In addition, as the lower electrode 11, when an electrically conductive oxide, such as ITO, or a metal film is used, a result similar to that described above may also be obtained. As the dielectric layer 12, when a film, such as a $ZrO_x$ film, formed using another high-k material is used instead of using a $HfO_x$ film, a result similar to that described above may also be obtained. In addition, as the silicon compound, when a material containing silicon other than a silane is used, a result similar to that described above may also be obtained.

[Image Sensor]

Figure 9:
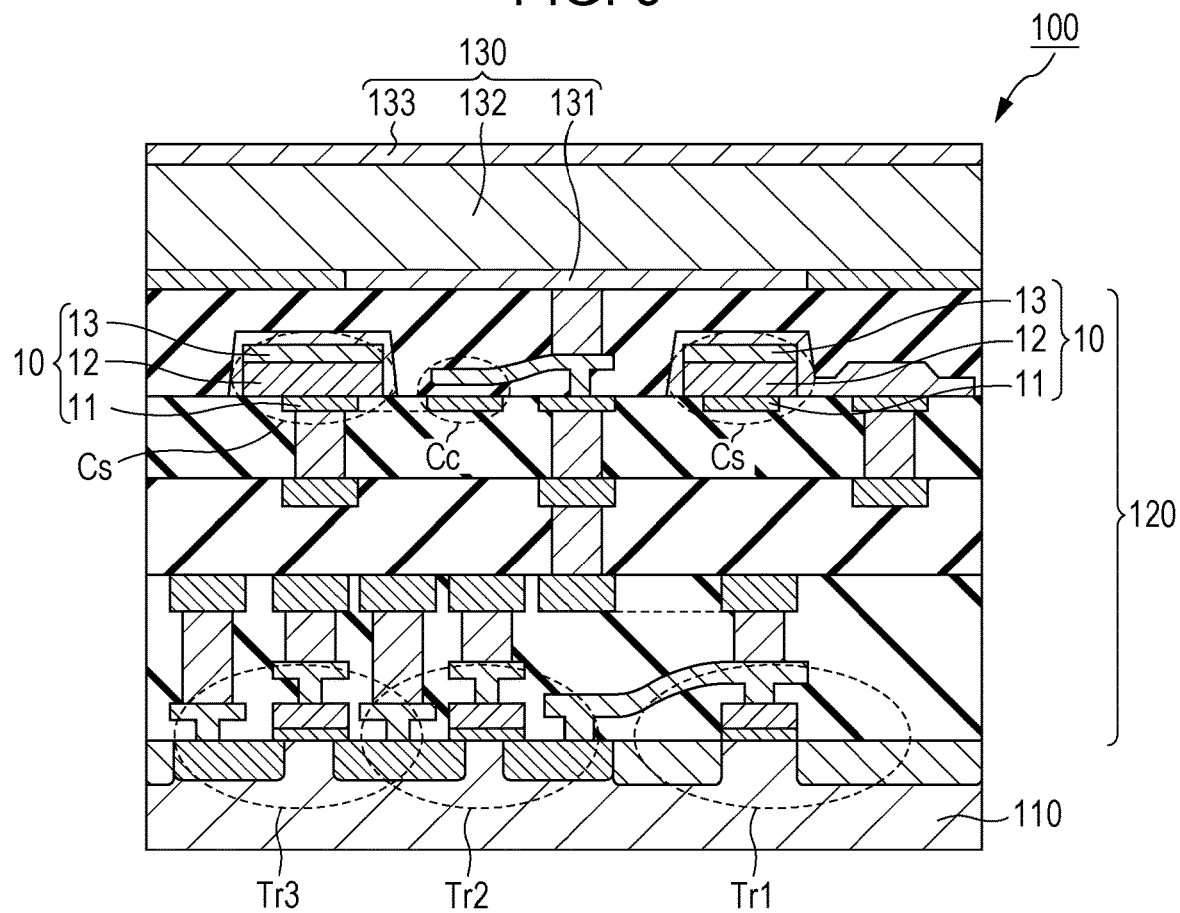
FIG. 9 is a schematic view showing a cross-sectional structure of an image sensor including the capacitor element according to the embodiment.

Next, an image sensor 100 including the capacitor element 10 according to this embodiment will be described with reference to FIG. 9. FIG. 9 is a schematic view showing a cross-sectional structure of the image sensor 100 according to this embodiment.

The image sensor 100 includes a plurality of pixels arranged in a matrix. The pixels each have a photoelectric conversion element generating an electric signal by performing photoelectric conversion of received light and a pixel circuit processing the electric signal generated by the photoelectric conversion element. FIG. 9 shows a cross-sectional structure of one pixel of the image sensor 100.

As shown in FIG. 9, the image sensor 100 according to this embodiment is an image sensor having a laminate structure in which a photoelectric conversion film 132 is laminated at an upper side of the pixel circuit. In particular, the image sensor 100 includes a substrate 110, a multilayer wiring structure 120, and a photoelectric conversion element 130.

The substrate 110 is a semiconductor substrate and is, for example, a Si substrate.

The multilayer wiring structure 120 includes a pixel circuit processing an electric signal generated by the photoelectric conversion element 130. In particular, as shown in FIG. 9, in the multilayer wiring structure 120, transistors Tr1, Tr2, and Tr3, capacitor elements Cs and Cc, and a plurality of wires are included.

The transistors Tr1, Tr2, and Tr3 are each a reset transistor, a charge reading transistor, or the like. The transistors Tr1, Tr2, and Tr3 are each, for example, a metal-oxide-semiconductor field-effect transistor (MOSFET). A source region, a drain region, and the like of each transistor are formed in a surface region of the substrate 110.

The capacitor element Cc is a capacitor element which stores a signal charge to be extracted from the photoelectric conversion element 130. The capacitor element Cs is a capacitor element which removes a kTc noise. The transistors, the capacitor elements, and the wires are isolated from each other, for example, by interlayer insulating films, such as silicon oxide films, each formed from an insulating material.

The photoelectric conversion element 130 includes a pixel electrode 131, the photoelectric conversion film 132, and a transparent electrode 133. The pixel electrode 131 and the transparent electrode 133 are disposed to face each other with the photoelectric conversion film 132 interposed therebetween. The photoelectric conversion film 132 is in surface contact with each of the pixel electrode 131 and the transparent electrode 133.

The pixel electrodes 131 are provided separately from each other for the respective pixels. The pixel electrode 131 is formed, for example, using an electrically conductive material, such as a metal including aluminum or copper.

The photoelectric conversion film 132 is formed using an organic material or an inorganic material, such as amorphous silicon. When light is incident on the photoelectric conversion film 132 through the transparent electrode 133, a signal charge corresponding to the amount of incident light is generated. The signal charge is extracted through the pixel electrode 131 and is then stored in the capacitor element Cc.

The transparent electrode 133 is formed, for example, using a transparent electrically conductive material, such as ITO. The transparent electrode 133 and the photoelectric conversion film 132 are, for example, commonly provided for all the pixels.

The capacitor element 10 according to this embodiment may be used, for example, as the capacitor element Cs. In particular, as shown in FIG. 9, the image sensor 100 includes the capacitor element 10 as the capacitor element Cs which removes a kTc noise. Since the lower electrode 11, the dielectric layer 12, and the upper electrode 13 are laminated in this order at an upper side of the substrate 110 and in the multilayer wiring structure 120, the capacitor element 10 is provided.

In addition, the capacitor element 10 may also be used as the capacitor element Cc which stores a signal charge. Accordingly, exposure to high luminance incident light can be performed without overexposure, and a pixel having a large number of saturated electrons can be realized.

Since the image sensor 100 according to this embodiment includes the capacitor element 10 having a high withstand voltage, the reliability can be improved. In addition, instead of the capacitor element 10, the image sensor 100 may include the capacitor element 20.

[Memory Device]

Figure 10:
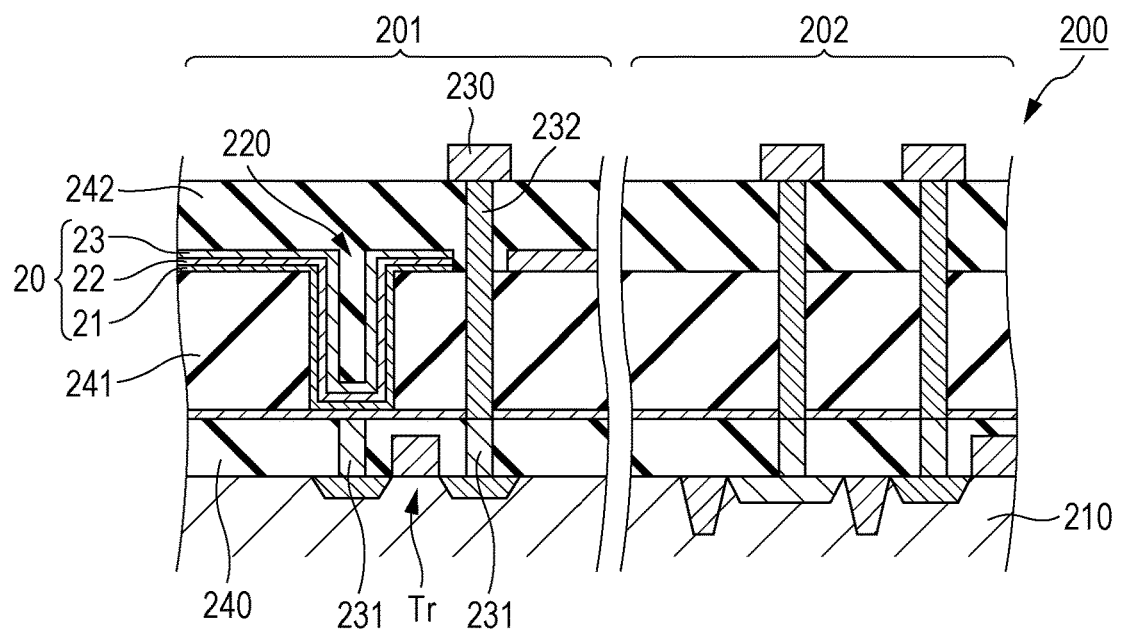
FIG. 10 is a schematic view showing a cross-sectional structure of a memory device including the capacitor element according to the embodiment.

Next, a memory device 200 including the capacitor element 20 according to this embodiment will be described with reference to FIG. 10. FIG. 10 is a schematic view showing a cross-sectional structure of the memory device 200 according to this embodiment.

The memory device 200 is a storage device, such as an embedded dynamic random access memory (eDRAM). In addition, the memory device 200 is not limited to an eDRAM as long as having a capacitor based storage device.

As shown in FIG. 10, the memory device 200 according to this embodiment includes on a substrate 210, a DRAM forming region 201, and a logic circuit forming region 202. In the DRAM forming region 201, a memory cell 220, a transistor Tr, and a wire layer 230 are provided.

In the memory device 200, for example, a plurality of DRAM forming regions 201 and a plurality of logic circuit forming regions 202 are arranged in a matrix. Since a charge is written into the memory cell 220 included in the DRAM forming region 201, the charge can be retained. FIG. 10 shows a cross-sectional structure of one unit region of the memory device 200.

The substrate 210 is a semiconductor substrate and is, for example, a Si substrate. On the substrate 210, insulating films 240, 241, and 242 are laminated in this order.

The memory cell 220 is, for example, the capacitor element 20 shown in FIG. 2. The memory cell 220 is provided on the insulating film 241 formed on the substrate 210. In particular, in the insulating film 241, a through-hole exposing an upper surface of the insulating film 240 is provided, and the memory cell 220 has a trench structure using this through-hole.

The lower electrode 21 of the memory cell 220 is connected to one of a source and a drain of the transistor Tr through a contact plug 231 penetrating the insulating film 240. In the memory cell 220, a charge supplied through the transistor Tr is stored.

The transistor Tr performs writing and reading of a charge into and from the memory cell 220. The transistor Tr is, for example, a MOSFET. The source, the drain, and the like of the transistor Tr are formed in a surface region of the substrate 210. The other one of the source and the drain of the transistor Tr is connected to another contact plug 231 penetrating the insulating film 240 and is also connected to the wire layer 230 through a contact plug 232 penetrating the insulating films 241 and 242.

The wire layer 230 is a wire to supply a writing charge to the memory cell 220 and to read a charge stored in the memory cell 220.

In the logic circuit forming region 202, the memory cell 220 is not provided. In the logic circuit forming region 202, for example, at least one transistor (not shown) is provided to form a logic circuit. For example, the logic circuit controls the transistor Tr in the DRAM forming region 201 and the like.

As described above, since the memory device 200 according to this embodiment includes the capacitor element 20 having a high withstand voltage, the reliability can be improved. In addition, instead of the capacitor element 20, the memory device 200 may include the capacitor element 10.

Other Embodiments

Although the capacitor element according to one or more aspects and the manufacturing method thereof, and the image sensor and the memory device have been described with reference to the embodiments, the present disclosure is not limited thereto. As long as not departing from the scope of the present disclosure, variously modified embodiments conceived by a person skilled in the art and embodiments each formed using constituent elements of the different embodiments in combination may also be included in the present disclosure.

For example, the content of silicon at the peak 91 of the convex portion 90 may be lower than 1 percent by atom and may be higher than 25 percent by atom. In addition, in the concentration distribution of silicon, the peak 91 is not required to be one point in the depth direction but may have a width in the depth direction.

In addition, for example, the peak 91 of the convex portion 90 may be located in the dielectric layer 12.

In addition, for example, in the concentration distribution of silicon, a convex portion which extends to two sides of an interface between the upper electrode 13 and the dielectric layer 12 may be included. That is, the upper electrode 13 may be one example of the first electrode, and the lower electrode 11 may be one example of the second electrode.

In addition, in the embodiments described above, various changes, replacements, additions, omissions, and the like may be performed within the scope of Claims or scopes equivalent thereto.

What is claimed is:

1. A capacitor comprising:
   a first electrode;
   a second electrode facing the first electrode; and
   a dielectric layer which is disposed between the first electrode and the second electrode and which is in contact with the first electrode, wherein
   an interface is defined between the first electrode and the dielectric layer,
   the first electrode includes a first portion facing the interface,
   the dielectric layer includes a second portion facing the interface,
   the first portion and the second portion each contain silicon,
   along a thickness direction of the first portion and the second portion, a concentration distribution of the silicon in the first portion and the second portion increases from a first value in the first portion to a second value, and decreases from the second value to a third value in the second portion, and
   a concentration of the silicon in the first portion and the second portion is maximum at the second value.

2. The capacitor according to claim 1, wherein the dielectric layer is made of at least one selected from the group consisting on a hafnium oxide and a zirconium oxide.

3. The capacitor according to claim 1, wherein the concentration of the silicon in the first portion and the second portion is maximum in the first portion.

4. The capacitor according to claim 1, wherein the second value is 1 to 25 atomic percent.

5. The capacitor according to claim 1, wherein the first electrode is made of at least one selected from the group consisting of a titanium nitride and a tantalum nitride.

6. The capacitor according to claim 1, wherein
   the concentration of the silicon in the first portion and the second portion is maximum in a range of ±10 nm from the interface in the thickness direction.

* * * * *